United States Patent [19]
Koshita

[11] Patent Number: 5,930,181
[45] Date of Patent: Jul. 27, 1999

[54] SEMICONDUCTOR MEMORY DEVICE WITH WRITE-SWITCH SIGNAL OUTPUT CIRCUITS USING COMPLEMENTARY WRITE DATA SIGNALS

[75] Inventor: Gen Koshita, Tokyo, Japan

[73] Assignee: NEC Corporation, Tokyo, Japan

[21] Appl. No.: 09/017,470

[22] Filed: Feb. 2, 1998

[30] Foreign Application Priority Data

Jan. 31, 1997 [JP] Japan ................................. 9-033138

[51] Int. Cl.$^6$ ........................................... G11C 7/00
[52] U.S. Cl. ................................ 365/190; 365/191
[58] Field of Search ............................. 365/190, 189.05, 365/189.01, 191

[56] References Cited

U.S. PATENT DOCUMENTS

| | | | |
|---|---|---|---|
| 5,291,447 | 3/1994 | Kodama et al. | 365/190 |
| 5,500,820 | 3/1996 | Nakaoka | 365/189.01 |
| 5,825,693 | 10/1998 | Lee et al. | 365/189.05 |

FOREIGN PATENT DOCUMENTS

| | | |
|---|---|---|
| 4-32089 | 2/1992 | Japan . |
| 6-20474 | 1/1994 | Japan . |
| 6-76580 | 3/1994 | Japan . |
| 6-111575 | 4/1994 | Japan . |
| 8-249884 | 9/1996 | Japan . |

*Primary Examiner*—Son Mai
*Attorney, Agent, or Firm*—Foley, Hoag & Eliot LLP

[57] ABSTRACT

Write switch signal output circuits for outputting write switch signals for controlling the turning-on/off of transfer gates for interconnecting digit lines and write data lines are supplied with a write enable signal that controls write timing and pairs of complementary write data signals outputted from write data output circuits. When the write data output circuits are inactive, the write switch signal output circuits inactivate the write switch signals because the paired complementary write data signals are of a precharged potential level. When the write data output circuits are active, the write switch signal output circuits activate the write switch signals when the write enable signal is active because write data is outputted as the paired complementary write data signals.

20 Claims, 5 Drawing Sheets

SEMICONDUCTOR MEMORY DEVICE WITH WRITE-SWITCH SIGNAL OUTPUT CIRCUITS USING COMPLEMENTARY WRITE DATA SIGNALS

BACKGROUND OF THE INVENTION

1. Field of the Invention

The present invention relates to a semiconductor memory device, and more particularly to a write circuit for use with a dynamic random-access memory (DRAM).

2. Description of the Related Art

One circuit arrangement for selecting write switches for a conventional semiconductor memory device will be described below. FIG. 1 of the accompanying drawings shows the layout of a circuit arrangement for selecting write switches of a DRAM which has a plurality of memory cell arrays and a plurality of sense amplifier columns. As shown in FIG. 1, sense amplifier columns 21, 22, 23 are disposed in sandwiching relationship to memory cells 31, 32. Write switch signal output circuits WSS21, WSS24 are disposed respectively at the opposite ends along word lines of the sense amplifier column 21. Similarly, write switch signal output circuits WSS22, WSS25 are disposed respectively at the opposite ends along word lines of the sense amplifier column 22, and write switch signal output circuits WSS23, WSS26 are disposed respectively at the opposite ends along word lines of the sense amplifier column 23. Write data output circuits WBUF21, WBUF22, WBUF23 are disposed at one of the opposite ends along word lines of the sense amplifier columns 21, 22, 23, respectively.

The sense amplifier columns 21, 22, 23 have respective pairs of write data signal lines WIT21/WIN21, WIT22/WIN22, WIT23/WIN23, parallel to word lines, for outputting complementary write data signals. Digit lines extend parallel to write enable signal lines which output a write enable signal (a write timing control signal) WE for controlling write timing.

The write data output circuits WBUF21, WBUF22, WBUF23 output complementary write data signals respectively to the paired write data signal lines WIT21/WIN21, WIT22/WIN22, WIT23/WIN23, and also output write select signals WSEL21, WSEL22, WSEL23 respectively to the write switch signal output circuits WSS21, WSS24, the write switch signal output circuits WSS22, WSS25, and the write switch signal output circuits WSS23, WSS26.

The write switch signal output circuits WSS21, WSS24, the write switch signal output circuits WSS22, WSS25, and the write switch signal output circuits WSS23, WSS26 are supplied with a write enable signal WE and respective write select signals WSEL21, WSEL22, WSEL23, and generate and output write switch signals WSW21, WSW24, write switch signals WSW22, WSW25, and write switch signals WSW23, WSW26, respectively, for controlling the turning-on/off of transfer gates which interconnect the digit lines and the write data signal lines. The write switch signals are applied to control terminals (gate electrodes) of the transfer gates, which control the connection and disconnection of digit lines and write data signal lines that are selected by column selection signals.

As shown in FIG. 1, one write data output circuit and two write switch signal output circuits are associated with each sense amplifier column because write switch signals impose a greater load than write data signals. Two write switch signal output circuits provided per sense amplifier column reduce the load imposed by write switch signals to half, improving characteristics in a write mode of operation of the DRAM.

FIG. 2 of the accompanying drawings shows a circuit arrangement of each of the write switch signal output circuits WSS21~WSS26. As shown in FIG. 2, the write switch signal output circuits WSS21~WSS26 are supplied with write select signals WSEL21, WSEL22, WSEL23 from the respective write data output circuits WBUF21, WBUF22, WBUF23 and output respective write switch signals WSW21~WSW26. The write switch signal output circuits WSS21~WSS26 are arranged such that the write switch signals WSW21~WSW26 outputted thereby go high when the write select signals WSEL21, WSEL22, WSEL23 go high and also the write timing control signal WE goes high. Specifically, each of the write switch signal output circuits WSS21~WSS26 is of an ANDing structure comprising an NAND gate NAND and an inverter INV. When the write data output circuits WBUF21, WBUF22, WBUF23 are activated, they output write data signals WIT21/WIN21, WIT22/WIN22, WIT23/WIN23, and the write select signals WSEL21~WSEL23 outputted thereby go high. The write switch signals WSW21~WSW26 may be turned on for only those sense amplifier columns to which write data are outputted. Therefore, the write switch signals WSW21~WSW26 are properly selected by making the write select signals WSEL21, WSEL22, WSEL23 high only when the write data output circuits WBUF21, WBUF22, WBUF23 are activated.

The conventional semiconductor memory device in which write switch signal output circuits are selected by write select signals, particularly, the circuit arrangement as shown in FIG. 1, is disadvantageous in that the chip size thereof is relatively large because signal lines for the write select signals run through the sense amplifier columns.

SUMMARY OF THE INVENTION

It is therefore an object of the present invention to provide a semiconductor memory device which has a relatively small chip size.

According to the present invention, a semiconductor memory device has write switch signal output circuits for outputting write switch signals for controlling the turning-on/off of transfer gates for interconnecting digit lines and write data lines. The write switch signal output circuits are supplied with a write enable signal that controls write timing and pairs of complementary write data signals outputted from write data output circuits. When the write data output circuits are inactive, the write switch signal output circuits inactivate the write switch signals because the paired complementary write data signals are of a precharged potential level (e.g., high level). When the write data output circuits are active, the write switch signal output circuits activate the write switch signals when the write enable signal is active because write data is outputted as the paired complementary write data signals. Therefore, write switch signals for only those sense amplifiers columns to which write data are outputted are activated.

The semiconductor memory device according to the present invention dispenses with write switch selecting signals (write select signals) on signal lines which have heretofore been extended in the sense amplifier columns from end to end, and employs write data signals from the write data signal lines that run through the sense amplifier columns from end to end. Therefore, the overall area taken up by each of the sense amplifier columns may be smaller by the area which has heretofore been occupied by the signal lines for the write select signals than the overall area taken up by each of the sense amplifier columns in the conventional semiconductor memory device.

The above and other objects, features, and advantages of the present invention will become apparent from the following description with reference to the accompanying drawings which illustrate examples of the present invention.

DESCRIPTION OF THE PREFERRED EMBODIMENT

Figure 1:
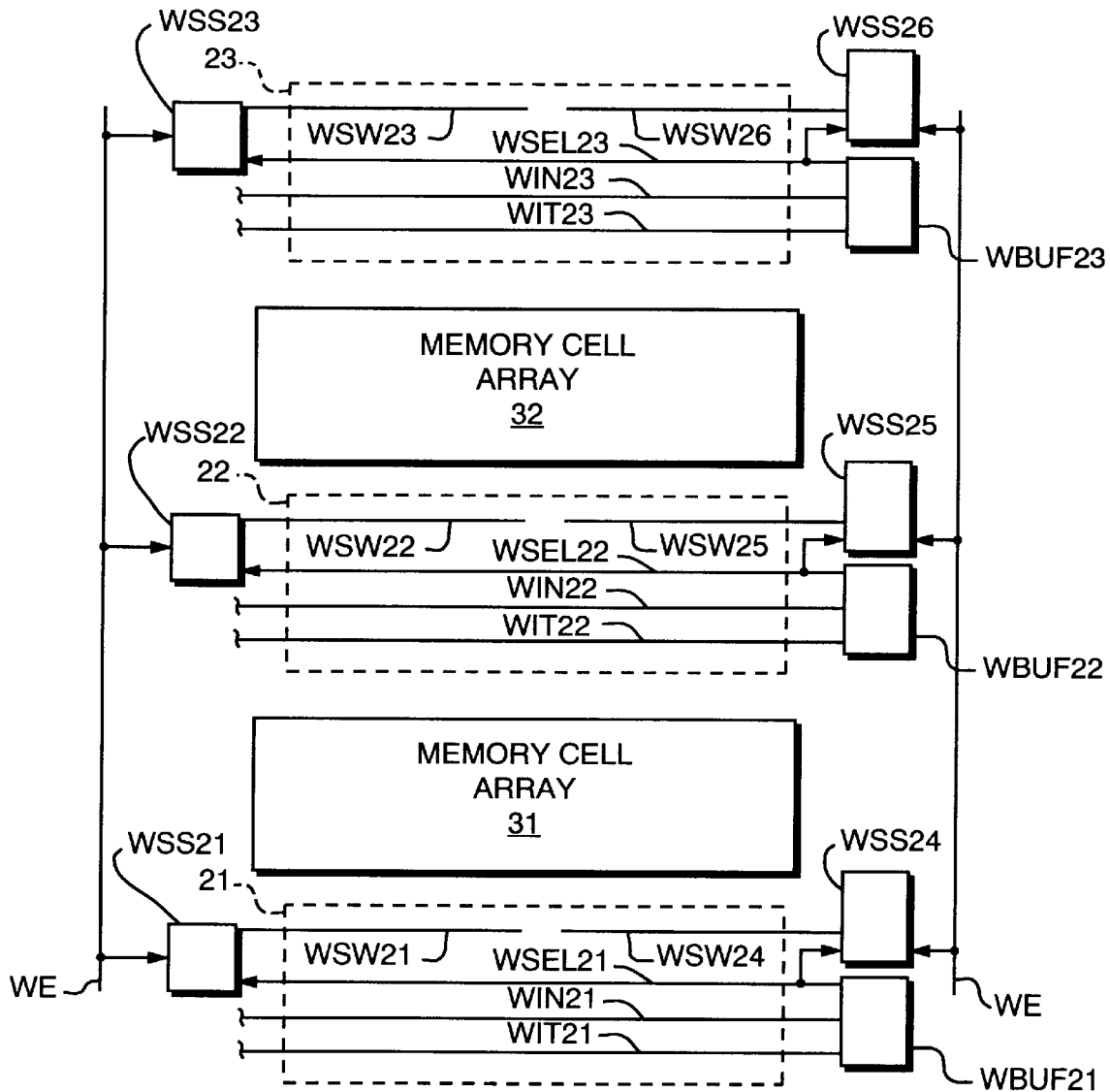
FIG. 1 is a block diagram of the layout of a circuit arrangement for selecting write switches of a conventional semiconductor memory device.
Figure 2:
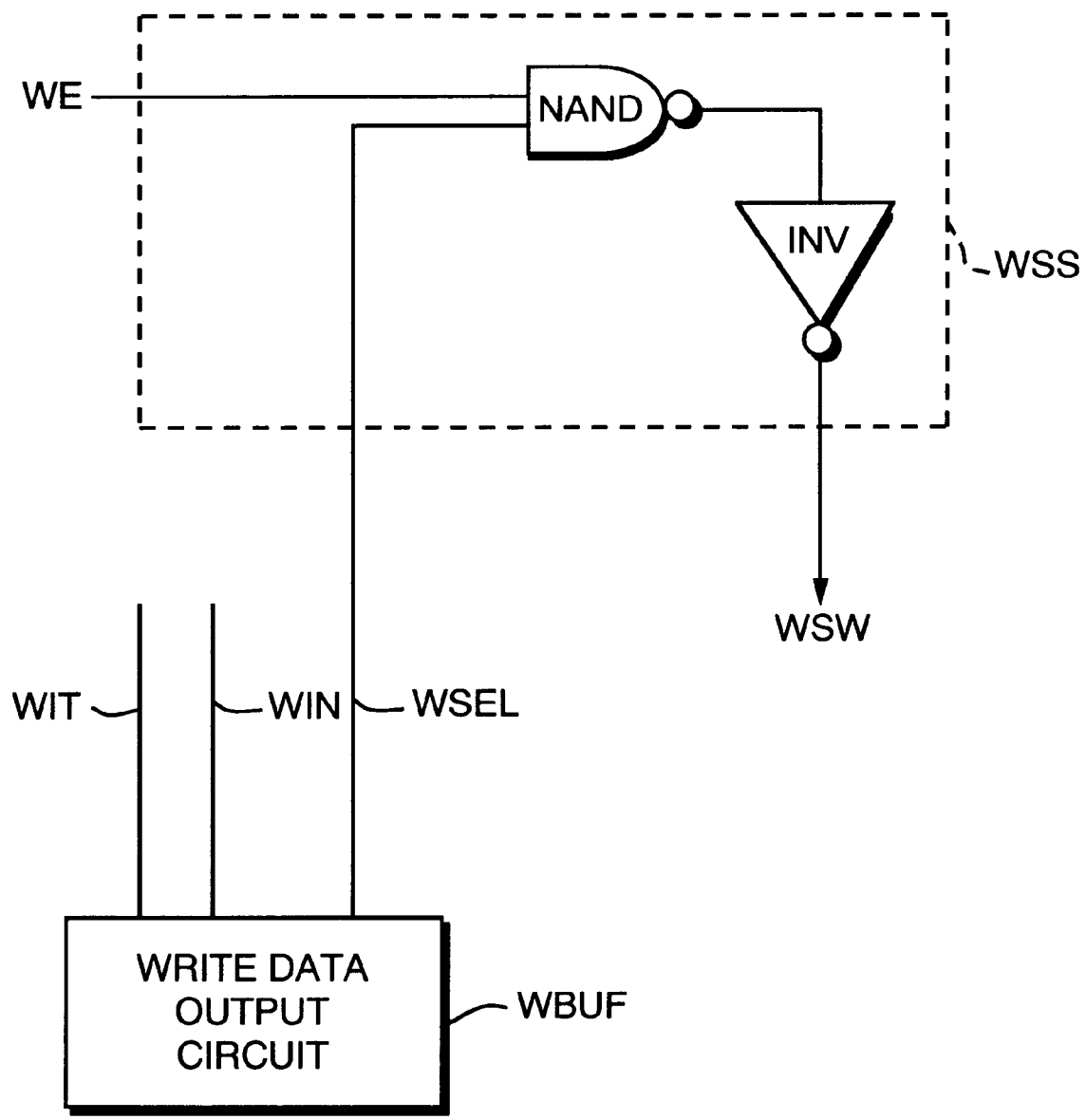
FIG. 2 is a block diagram of a write switch signal output circuit of the circuit arrangement shown in FIG. 1.
Figure 3:
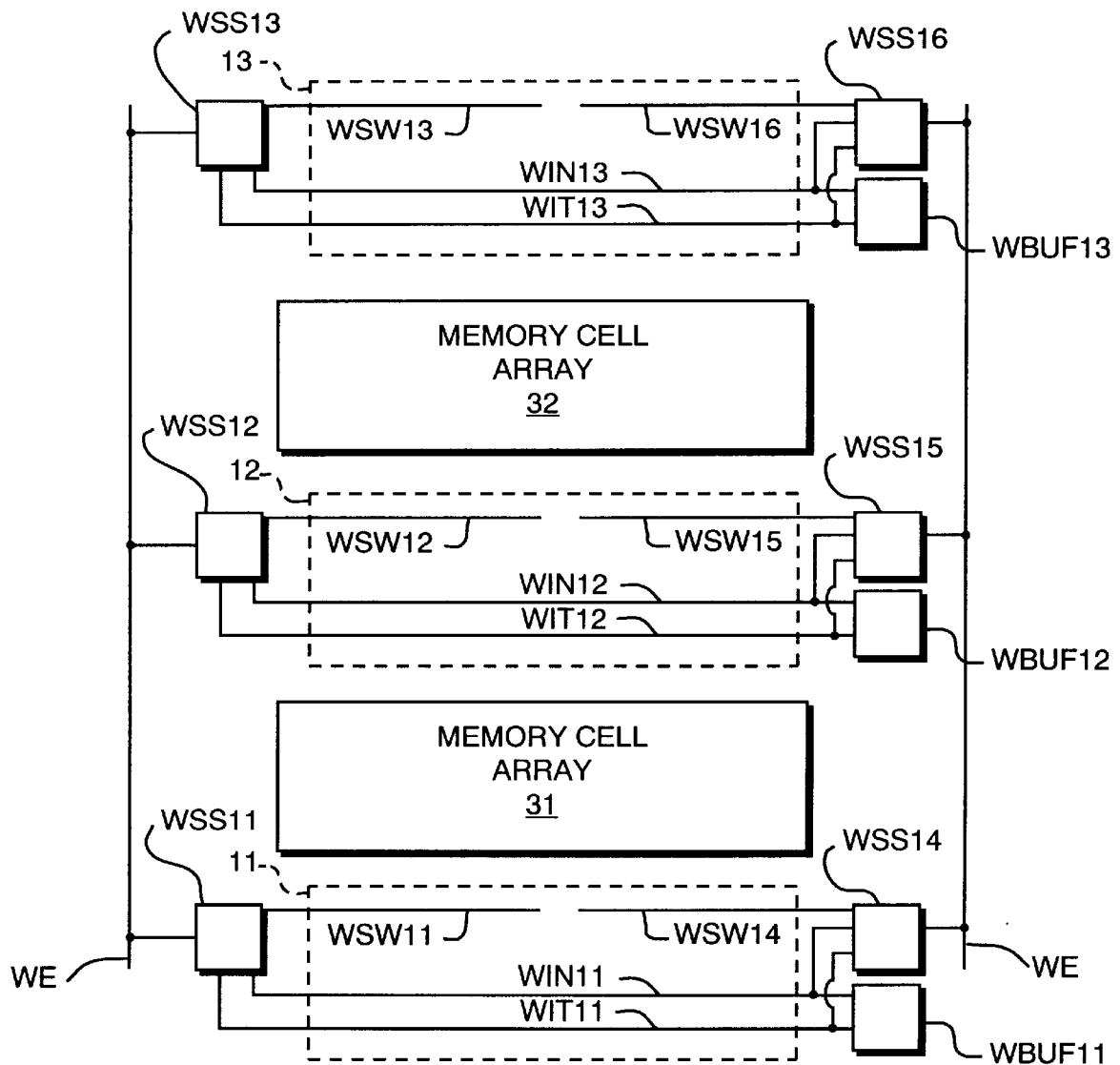
FIG. 3 is a block diagram of the layout of a circuit arrangement for selecting write switches of a semiconductor memory device according to the present invention.
Figure 4:
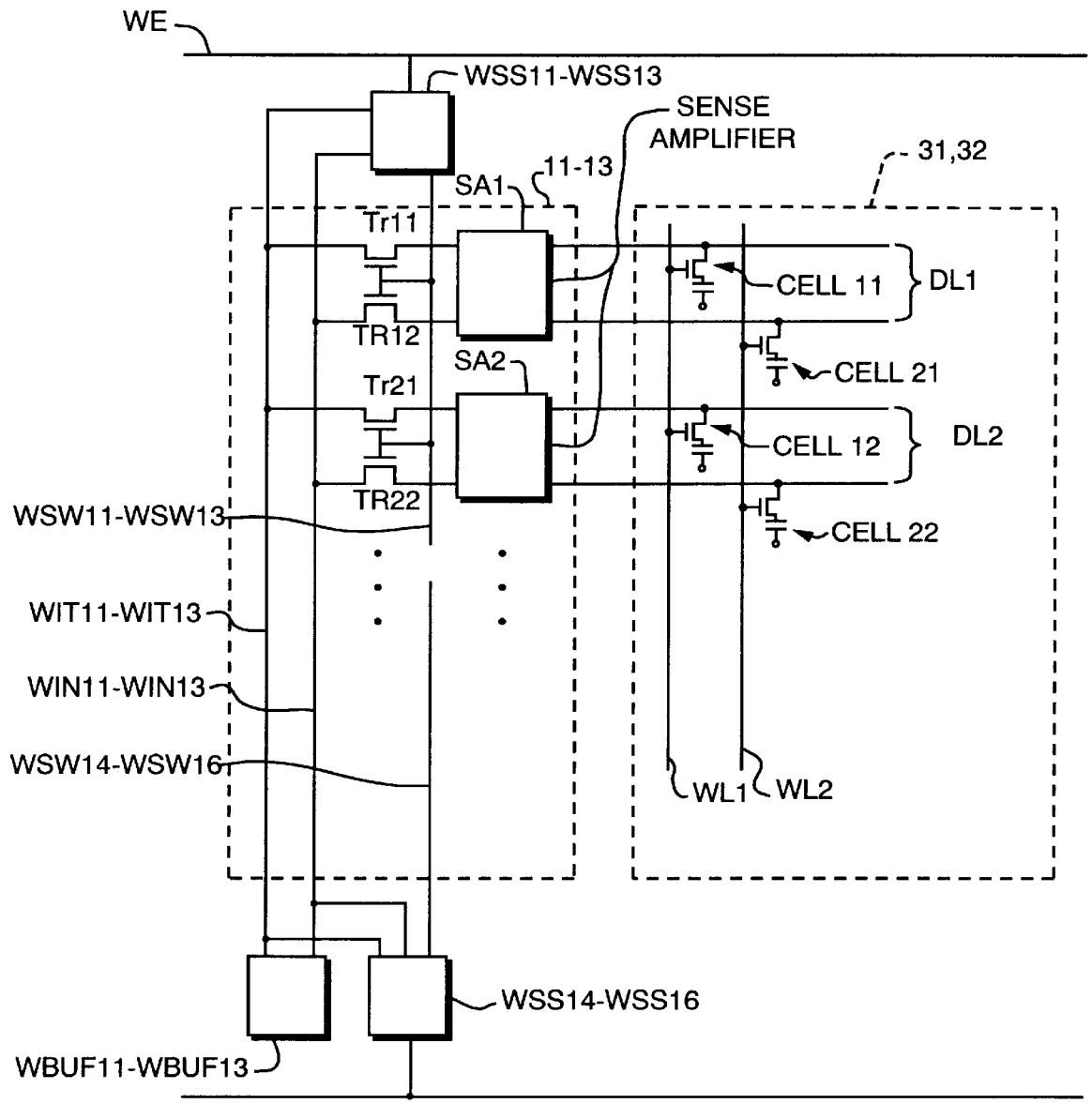
FIG. 4 is a view showing the constructions of sense amplifier columns and memory cells.

As shown in FIG. 3 and 4, sense amplifier columns 11, 12, 13 are disposed in sandwiching relationship to memory cell 31, 32 arrays. The memory cell arrays 31–32 include word lines WL1, WL2, - - - , digit line pair DL1, DL2, - - - and memory cells Cell 11, Cell 12 Cell 21, Cell 22, - - - . Write switch signal output circuits WSS11, WSS14 are disposed respectively at the opposite ends along the word lines WL1, WL2, - - - of the sense amplifier column 11. Similarly, write switch signal output circuits WSS12, WSS15 are disposed respectively at the opposite ends along the word lines WL11, W12, - - - of the sense amplifier column 12, and write switch signal output circuits WSS13, WSS16 are disposed respectively at the opposite ends along the word lines WLll, W12, - - - of the sense amplifier column 13. Write data output circuits WBUF11, WBUF12, WBUF13 are disposed at one of the opposite ends along the word lines WL11, WL12, - - - of the sense amplifier columns 11, 12, 13, respectively.

The sense amplifier columns 11, 12, 13 have sense amplifiers SA1, SA2, - - - , transfer gates Tr11, Tr12, Tr21, Tr22, - - - and respective pairs of write data signal lines WIT11/WIN11, WIT12/WIN12, WIT13/WIN13, parallel to the word lines WL11, WL12, - - - for outputting complementary write data signals. Digit lines extend parallel to write enable signal lines which output a write enable signal (a write timing control signal) WE for controlling write timing.

The write data output circuits WBUF11, WBUF12, WBUF13 output complementary write data signals respectively to the paired write data signal lines WIT11/WIN11, WIT12/WIN12, WIT13/WIN13. The write switch signal output circuits WSS11, WSS14, the write switch signal output circuits WSS12, WSS15, and the write switch signal output circuits WSS13, WSS16 are supplied with a write enable signal WE and complementary write data signals from the respective write data signal lines WIT11/WIN11, WIT12/WIN12, WIT13/WIN13, and generate and output write switch signals WSW11, WSW14, write switch signals WSW12, WSW15, and write switch signals WSW13, WSW16, respectively, for controlling the turning-on/off of the transfer gates Tr11, Tr12, Tr21, Tr22, - - - which interconnect the digit lines DL1, DL2, - - - and the write data signal lines. The write switch signals are applied to control terminals (gate electrodes) of the transfer gates Tr11, Tr12, Tr21, Tr22, - - - , which control the connection and disconnection of digit lines DL1, DL2, - - - and write data signal lines that are selected by column selection signals.

According to the illustrated embodiment of the present invention, the write data signal lines WIT11/WIN11, WIT12/WIN12, WIT13/WIN13 are precharged to a high level when the write data output circuits WBUF11, WBUF12, WBUFl3 are inactivated. When the write data output circuits WBUF11, WBUF12, WBUF13 are activated, only one of the paired data signal lines WIT11/WIN11, WIT12/WIN12, WIT13/WIN13 goes low, outputting write data.

Figure 5:
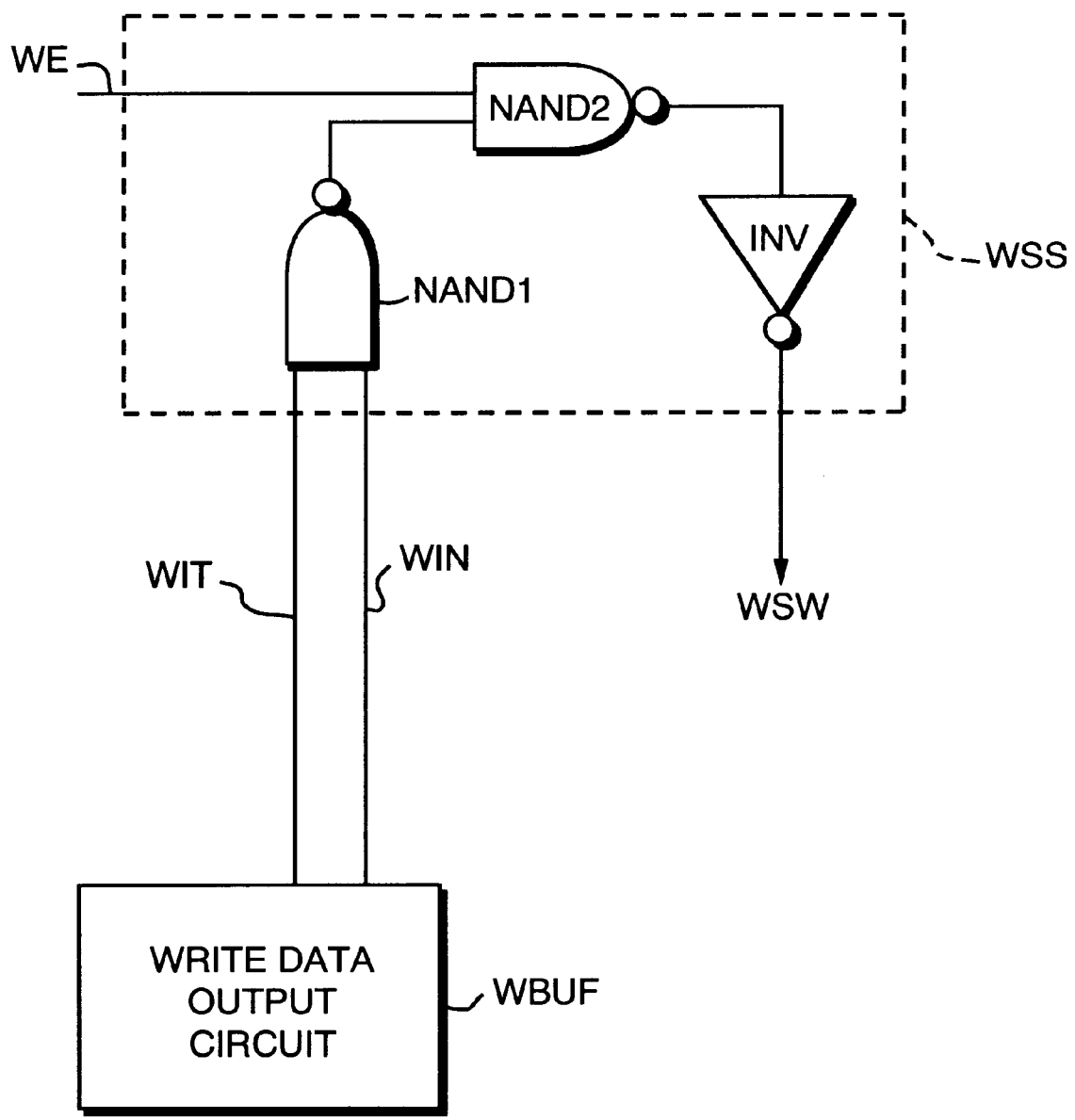
FIG. 5 is a block diagram of a write switch signal output circuit of the circuit arrangement shown in FIG. 3.

As shown in FIG. 5, each of the write switch signal output circuits WSS11~WSS16, collectively represented by WSS, comprises two NAND gates NAND1, NAND2 and an inverter INV. Complementary write data signals WIT/WIN, which collectively represent write data signals from the write data signal lines WIT11/WIN11, WIT12/WIN12, WIT13/WIN13 shown in FIG. 3, are supplied to the NAND gate NAND1. When no write data is outputted, since both the complementary write data signals WIT/WIN are high, the write switch signal output circuit WSS outputs a low-level signal. When write data is outputted, since either one of the complementary write data signals WIT/WIN is low, the write switch signal output circuit WSS outputs a high-level signal.

When the write enable signal WE, which is a write timing control signal, goes high while an output signal from the NAND gate NANDl is high, the NAND gate NAND2 which is supplied with the output signal from the NAND gate NAND1 and the write enable signal WE outputs a low-level signal. The outputted low-level signal is converted into a high-level signal by the inverter INV which outputs a write switch signal WSW. Therefore, the write switch signal output circuit WSS outputs a write switch signal WSW which is of a high level.

The semiconductor memory device according to this embodiment dispenses with write select signals WSEL, and employs write data signals WIT/WIN from the write data signal lines that run through the sense amplifier columns from end to end. Therefore, the overall area taken up by each of the sense amplifier columns may be smaller by the area which has heretofore been occupied by signal lines for the write select signals WSEL than the overall area taken up by each of the sense amplifier columns in the conventional semiconductor memory device.

While a preferred embodiment of the present invention has been described using specific terms, such description is for illustrative purposes only, and it is to be understood that changes and variations may be made without departing from the spirit or scope of the following claims.

What is claimed is:

1. A semiconductor memory device comprising:
   a plurality of memory cell arrays;
   a plurality of sense amplifier columns disposed in sandwiching relation to each of said memory cell arrays;
   word lines;
   digit lines;
   a plurality of pairs of write data signal lines disposed respectively in said sense amplifier columns and extending parallel to said word lines;
   a write enable line extending parallel to said digit lines;
   transfer gates for interconnecting said digit lines and said write data signal lines;
   write data output circuits for outputting pairs of complementary write data signals respectively to said pairs of write data signal lines; and write switch signal output circuits for logically processing complementary write data signals from said write data circuits and a write enable signal from said write enable line to generate and output write switch signals for controlling the turning-on/off of said transfer gates.

2. A semiconductor memory device according to claim 1, wherein said write switch signal output circuits are arranged to activate said write switch signals only when said write data circuits output complementary write data signals to said pairs of write data signal lines.

3. A semiconductor memory device according to claim 2, wherein said write switch signal output circuits are arranged such that when said write data output circuits are inactive, said write switch signal output circuits detect that the complementary write data signals are of the same level and inactivate said write switch signals, and when said write data output circuits are active, said write switch signal output circuits activate said write switch signals when said write enable signal is active based on a difference in level between the complementary write data signals.

4. A semiconductor memory device according to claim 3, wherein each of said write switch signal output circuits comprises a first NAND gate for being supplied with a pair of said complementary write data signals, a second NAND gate for being supplied with said write enable signal and an output signal from said first NAND gate, and an inverter for inverting an output signal from said second NAND gate and outputting an inverted signal as one of said write switch signals.

5. A circuit for providing a write select signal in a semiconductor memory device, comprising:

a first gate that provides a first signal at an output thereof in response to a complementary pair of write data signal lines from a buffer indicating that said buffer is inactivated, said first gate providing a second signal at said output different than said first signal in response to said complementary pair of write data signal lines from said buffer indicating that said buffer is activated; and a second gate, coupled to a write enable signal and to said output of said first gate, said second gate providing the write select signal in response to said write enable signal and said second signal being asserted.

6. A circuit, according to claim 5, wherein one of said complementary pair of write data signal lines provides a signal at an equal level to another one of said complementary pair of write data signal lines to indicate that said buffer is inactivated.

7. A circuit, according to claim 6, wherein both of said complementary pair of write data signal lines provide a high signal to indicate that said buffer is inactivated.

8. A circuit, according to claim 5, wherein one of said complementary pair of write data signal lines provides a signal at a different level than another one of said complementary pair of write data signal lines to indicate that said buffer is activated.

9. A circuit, according to claim 8, wherein said first and second gates are NAND gates.

10. A circuit for providing a write select signal in a semiconductor memory device, comprising:

means for determining whether a complementary pair of write data signal lines from a buffer indicate that said buffer is activated; and means, responsive to said means for determining, for asserting the write select signal in response to said buffer being activated and a write enable signal being asserted.

11. A circuit, according to claim 10, wherein both of said complementary pair of write data signal lines provide a signal at an equal level to indicate that said buffer is inactivated and provide signals at different levels to indicate that said buffer is activated.

12. A semiconductor memory device, comprising:

at least one memory cell array;

at least one sense amplifier column having a plurality of sense amplifiers coupled to said at least one memory cell array via a plurality of digit lines;

a write buffer coupled to said sense amplifiers by a complementary pair of write data signal lines, said write buffer having an active state and an inactive state; and a write select circuit that provides a write select signal to said sense amplifier column in response to said complementary pair of write data signal lines indicating that said write buffer is active and a write enable signal being asserted.

13. A semiconductor memory device, according to claim 12, further comprising:

a plurality of transfer gates, interposed between said complementary pair of write data signal lines and said plurality of sense amplifiers, wherein control electrodes of said transfer gates are coupled to said write select circuit.

14. A semiconductor memory device, according to claim 13, wherein said write select circuit asserts the write select signal to cause said transfer gates to provide signals from said complementary pair of write data signal lines to said plurality of sense amplifiers.

15. A semiconductor memory device, according to claim 14, further comprising:

a plurality of word lines, coupled to said memory cell array to cause data signals provided by said digit lines to be stored in cells of said memory cell array.

16. A method of operating a semiconductor memory device, comprising:

providing a complementary pair of write data signal lines at a write data buffer, where a relative state of the complementary pair of write data signal lines indicates if the write data buffer is active; and providing a write select signal in response to a write enable signal being asserted and the complementary pair of write data signal lines indicating that the write data buffer is active.

17. A method, according to claim 16, further comprising:

causing signals from the complementary pair of write data signal lines to be provided to sense amplifiers.

18. A method, according to claim 17, further comprising:

providing signals from the sense amplifiers to a memory array of the semiconductor memory device.

19. A method, according to claim 18, further comprising:

using word lines of the semiconductor memory device to cause the signals from the sense amplifiers to be stored in the memory array.

20. The method of claim 16, further comprising:

controlling, in response to said write select signal, turning on/off of transfer gates, said transfer gates interconnecting digit lines and said complementary pair of write data signal lines.

* * * * *